United States Patent
Hsu et al.

(10) Patent No.: US 12,029,049 B2
(45) Date of Patent: Jul. 2, 2024

(54) MEMORY STRUCTURES AND METHODS FOR FORMING THE SAME

(71) Applicant: Winbond Electronics Corp., Taichung (TW)

(72) Inventors: Po-Yen Hsu, New Taipei (TW); Bo-Lun Wu, Changhua County (TW); Tse-Mian Kuo, New Taipei (TW); Wei-Che Chang, Taichung (TW); Shuo-Che Chang, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 550 days.

(21) Appl. No.: 17/123,513

(22) Filed: Dec. 16, 2020

(65) Prior Publication Data

US 2022/0190033 A1 Jun. 16, 2022

(51) Int. Cl.
*H10B 63/00* (2023.01)
*H10N 70/00* (2023.01)
*H10N 70/20* (2023.01)

(52) U.S. Cl.
CPC ......... *H10B 63/845* (2023.02); *H10N 70/066* (2023.02); *H10N 70/24* (2023.02); *H10N 70/823* (2023.02); *H10N 70/828* (2023.02); *H10N 70/841* (2023.02)

(58) Field of Classification Search
CPC .................................................. H10B 63/845
See application file for complete search history.

(56) References Cited

U.S. PATENT DOCUMENTS

| | | | |
|---|---|---|---|
| 7,161,167 B2 | 1/2007 | Johnson | |
| 2011/0149656 A1 | 6/2011 | Tang et al. | |
| 2012/0248504 A1* | 10/2012 | Liu | H10B 63/30 257/E23.141 |
| 2016/0233270 A1 | 8/2016 | Takaki et al. | |

FOREIGN PATENT DOCUMENTS

JP 2015122478 A 7/2015

* cited by examiner

*Primary Examiner* — Moazzam Hossain
*Assistant Examiner* — Hajar Kolahdouzan
(74) *Attorney, Agent, or Firm* — MUNCY, GEISSLER, OLDS & LOWE, P.C.

(57) ABSTRACT

A memory device includes a substrate, an electrical channel layer, a first electrode, a resistive switching layer, a second electrode, and a conductive structure. The electrical channel layer is disposed on the substrate. The first electrode is disposed on the substrate and extends into the electrical channel layer. The resistive switching layer is disposed between the first electrode and the electrical channel layer. The second electrode is disposed on the electrical channel layer. The conductive structure connects the electrical channel layer and the second electrode.

20 Claims, 5 Drawing Sheets

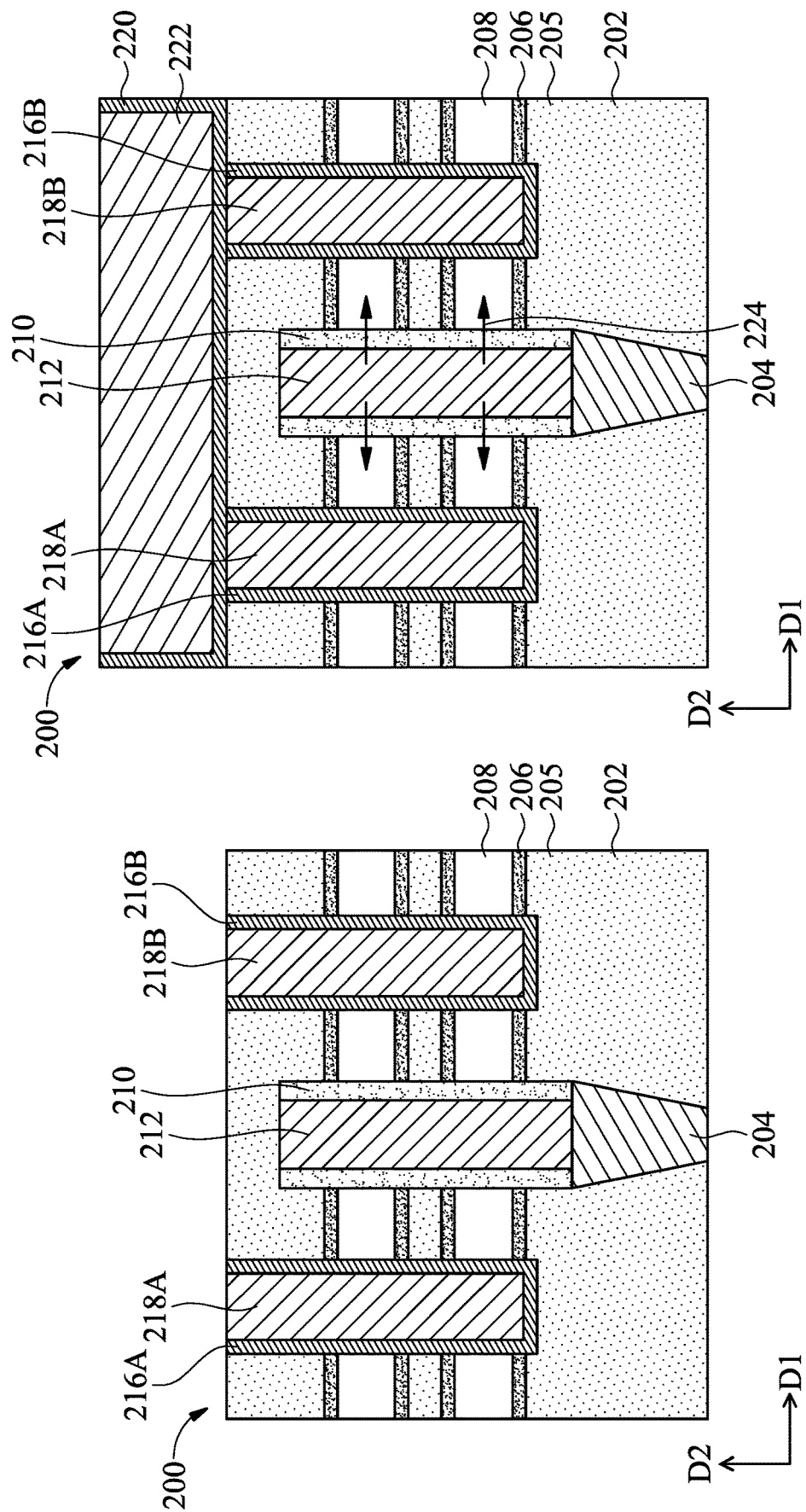

MEMORY STRUCTURES AND METHODS FOR FORMING THE SAME

BACKGROUND OF THE INVENTION

Field of the Invention

The present disclosure relates in general to semiconductor manufacturing, and in particular it relates to memory structures and methods for forming the same.

Description of the Related Art

As semiconductor devices are gradually miniaturized, the difficulty of manufacturing these semiconductor devices increases dramatically, and undesirable defects may occur during the manufacturing process, which may cause degradation or damage to the device. Therefore, semiconductor devices must be continuously improved to increase the yield and improve the process window.

BRIEF SUMMARY OF THE INVENTION

In accordance with some embodiments of the present disclosure, a memory structure is provided. The memory structure includes a substrate, an electrical channel layer, a first electrode, a resistive switching layer, a second electrode, and a conductive structure. The electrical channel layer is disposed on the substrate. The first electrode is disposed on the substrate and extends into the electrical channel layer. The resistive switching layer is disposed between the first electrode and the electrical channel layer. The second electrode is disposed on the electrical channel layer. The conductive structure connects the electrical channel layer and the second electrode.

In accordance with some embodiments of the present disclosure, a memory structure is provided. The memory structure includes a substrate, an electrical channel layer, a first electrode, a resistive switching layer, a second electrode, and a conductive structure. The electrical channel layer is disposed on the substrate and extends along a first direction. The first electrode is disposed on the substrate and extends into the electrical channel layer along a second direction, and the second direction is different from the first direction. The resistive switching layer is disposed between the first electrode and the electrical channel layer. The second electrode is disposed on the electrical channel layer, wherein the substrate, the electrical channel layer and the second electrode are stacked along the second direction. The conductive structure connects the electrical channel layer and the second electrode and extends along the second direction.

In accordance with some embodiments of the present disclosure, a method of forming a memory structure is provided. The method includes forming an electrical channel layer on a substrate; forming a first electrode on the substrate and extending into the electrical channel layer; forming a resistive switching layer between the first electrode and the electrical channel layer; and forming a conductive structure on the electrical channel layer and connecting to a second electrode.

BRIEF DESCRIPTION OF THE DRAWINGS

The present disclosure can be more fully understood from the following detailed description when read with the accompanying figures. It should be noted that, in accordance with standard practice in the industry, various features are not drawn to scale and are for illustrative purposes only. In fact, the dimensions of elements may be arbitrarily increased or reduced for clarity of the features of the embodiments of the present disclosure.

FIGS. 2A-2E are cross-sectional views illustrating a memory structure at various stages of manufacture in accordance with some embodiments.

DETAILED DESCRIPTION OF THE INVENTION

Figure 2A:
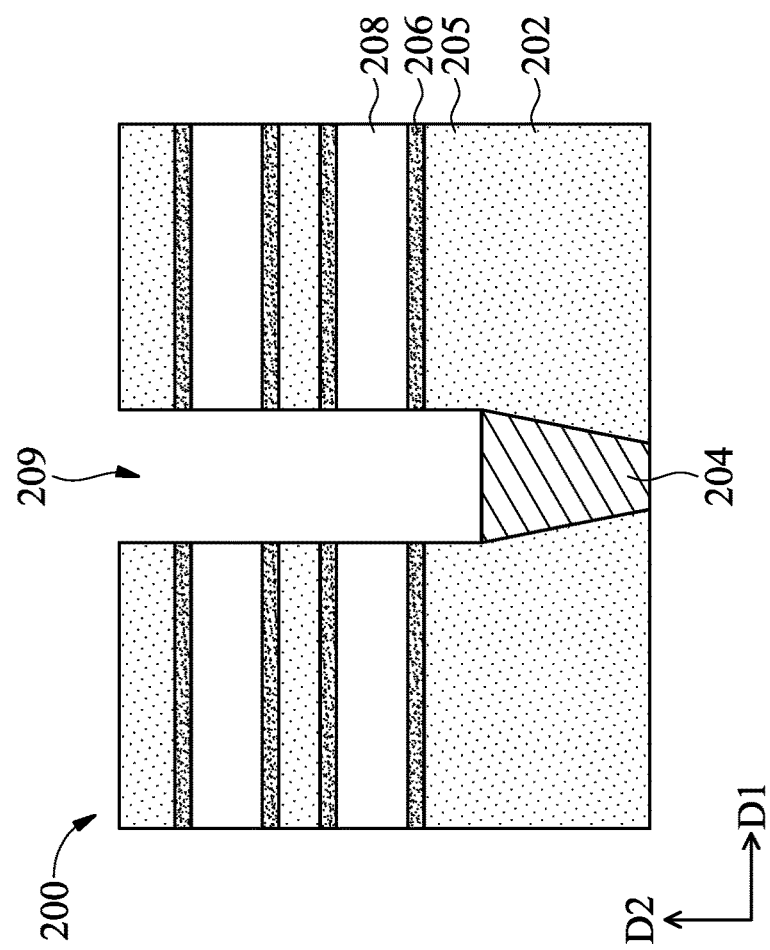

The following description provides several embodiments so that those skilled in the art may better understand the present disclosure. However, these embodiments are examples only and are not intended to limit the present disclosure. It is understandable that those skilled in the art may adjust the embodiments described below according to requirements, for example, changing the sequences of processes and/or including more or fewer steps than described herein, and these adjustments do not exceed the scope of the present disclosure.

Furthermore, other elements may be added on the basis of the embodiments described below. For example, the description of "forming a second element on a first element" may include embodiments in which the first element is in direct contact with the second element, and may also include embodiments in which additional elements are disposed between the first element and the second element such that the first element and the second element are not in direct contact. Spatially relative descriptors of the first element and the second element may change as the device is operated or used in different orientations.

In the following description, the description of "a first element passing through a second element" may include embodiments in which the first element is in the second element and extends from a side of the second element to an opposite side of the second element, wherein a surface of the first element may be leveled with a surface of the second element, or a surface of the first element may be outside a surface of the second element. In addition, the present disclosure may repeat reference numerals and/or letters in the various embodiments. This repetition is for simplicity and clarity and does not in itself dictate a relationship between the various embodiments discussed.

Memory structures and methods for forming the same are described below in accordance with some embodiments of the present disclosure, and they are particularly suitable for non-volatile memory (NVM), such as a resistive random-access memory (RRAM). In the present disclosure, a resistive switching layer is disposed to extend into an electrical channel layer, thereby increasing the number of conductive filaments without increasing the forming voltage, and improving data retention.

Figure 1:
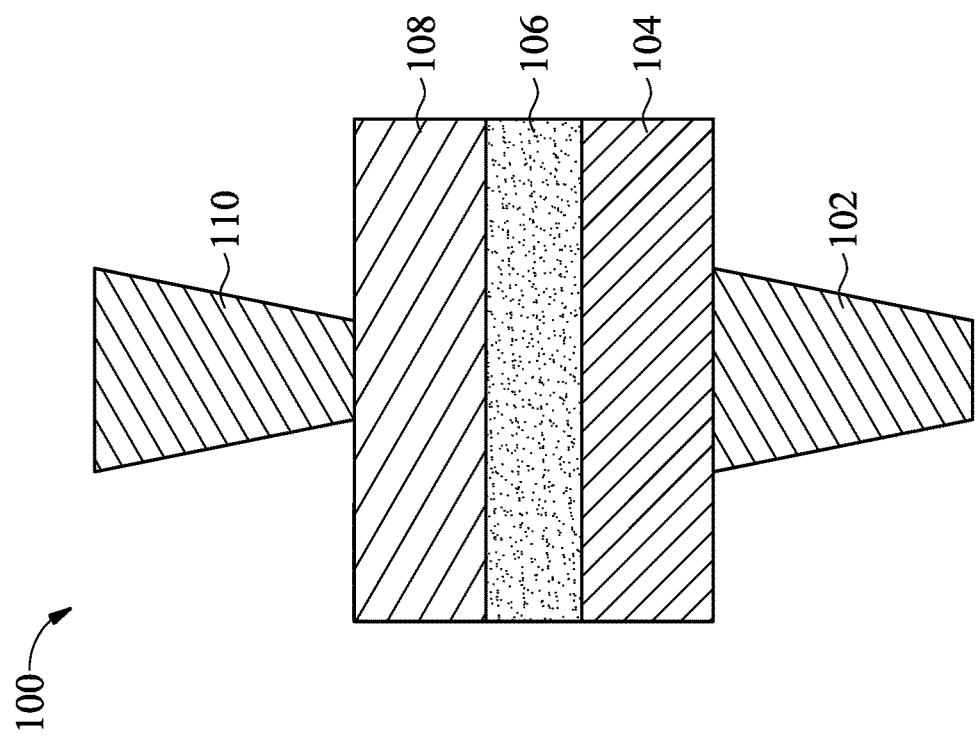
FIG. 1 is a cross-sectional view illustrating a memory structure in accordance with some embodiments.

FIG. 1 is a cross-sectional view illustrating a memory structure 100 in accordance with some embodiments. As illustrated in FIG. 1, the memory structure 100 may include contacts 102 and 110, which may connect to a first electrode 104 and a second electrode 108, respectively. The memory structure 100 may include a resistive switching layer 106 between the first electrode 104 and the second electrode 108.

When a forward voltage is applied to the memory device 100, the oxygen ions in the resistive switching layer 106 migrate to the electrode above the resistive switching layer 106, and an oxygen vacancy filament (not illustrated) is formed in the resistive switching layer 106, so that the resistive switching layer 106 is converted into a low resistance state. Conversely, when a reverse voltage is applied to the memory device 100, the oxygen ions return to the resistive switching layer 106 and combine with the oxygen vacancies in the resistive switching layer 106, causing the oxygen vacancy filament to be cut, and the resistive switching layer 106 is converted into a high resistance state. The memory device 100 converts the resistance by this way to store or read data to achieve the memory function.

In some embodiments, the high temperature used during the manufacturing process of the memory structure may reduce the current in the low resistance state, making data retention worse. Since the current of the conductive filament is related to the oxygen vacancy concentration, some methods increase the thickness of the resistive switching layer 106 to provide more oxygen vacancies to increase the current in the low resistance state, thereby improving data retention. However, these methods also introduce some problems. For example, since the material of the resistive switching layer 106 is not easily etched, increasing the thickness of the resistive switching layer 106 also increases the difficulty of the etching process, for example, it may be difficult to form the resistive switching layer 106 into a desired shape. In addition, increasing the thickness of the resistive switching layer 106 also increases the forming voltage of the memory structure 100, which is unfavorable to mass production of the memory structure 100. Therefore, the present disclosure further provides the following embodiments to improve the above-mentioned problems.

FIGS. 2A-2E are cross-sectional views illustrating a memory structure 200 in accordance with some other embodiments. As illustrated in FIG. 2A, the memory structure 200 may include a substrate 202. Any substrate material suitable for the memory structure 200 may be used for the substrate 202. For example, the substrate 202 may include an oxide.

In some embodiments, the memory structure 200 may include a contact 204 disposed in the substrate 202. The contact 204 may include conductive materials, such as doped or undoped polysilicon, metal, the like, or a combination thereof. For example, the metal includes gold, nickel, platinum, palladium, iridium, titanium, chromium, tungsten, aluminum, copper, tantalum, hafnium, the like, an alloy thereof, a multilayer thereof, or a combination thereof. According to some embodiments, the deposition process used for the conductive material may include a physical vapor deposition (PVD) process, a chemical vapor deposition (CVD) process, an atomic layer deposition (ALD) process, an evaporation process, an electroplating process, the like, or a combination thereof.

Then, according to some embodiments, a dielectric layer 205 is formed on the contact 204 and covers the contact 204. In some embodiments, the dielectric layer 205 and the substrate 202 include the same material, so the interface between the dielectric layer 205 and the substrate 202 is not illustrated. In other embodiments, the dielectric layer 205 and the substrate 202 include different materials, and there may be an interface between the dielectric layer 205 and the substrate 202. The dielectric layer 205 may be formed by CVD, ALD, the like, or a combination thereof.

Then, according to some embodiments, a pair of high-k layers 206 and an electrical channel layer 208 between the high-k layers 206 are formed on the dielectric layer 205. The high-k layers 206 and the electrical channel layer 208 may extend along the first direction D1. The high-k layers 206 may include a material with dielectric constant (k) greater than 3.9, such as tantalum oxide, hafnium oxide, aluminum oxide, the like, or a combination thereof. The electrical channel layer 208 may include titanium, titanium nitride, tantalum, tantalum nitride, hafnium, hafnium nitride, the like, or a combination thereof. The formation method of the high-k layer 206 and the electrical channel layer 208 may be similar to the formation method of the dielectric layer 205, and will not be repeated.

The number of electrical channel layers 208 is related to the amount of current. Although two electrical channel layers 208 are illustrated herein, the present disclosure is not limited thereto. More or fewer electrical channel layers 208 may be used according to the amount of current, and dielectric layers 205 may be provided between these electrical channel layers 208. Then, a dielectric layer 205 is deposited on the uppermost electrical channel layer 208.

Then, according to some embodiments, a trench 209 is etched in the memory device 200. As illustrated in FIG. 2A, the trench 209 may pass through the dielectric layer 205, the high-k layer 206, and the electrical channel layer 208, and expose the contact 204. The trench 209 may extend along a second direction D2, and the second direction D2 is different from the first direction D1. The second direction D2 may be substantially perpendicular or orthogonal to the first direction D1. Alternatively, an angle between the first direction D1 and the second direction D2 may be in a range from about 80° to about 90°.

In some embodiments, the trench 209 may be formed by disposing a mask layer (not illustrated) on the dielectric layer 205, and then using the mask layer as an etching mask for an etching process. In some embodiments, the mask layer may include a hard mask, and may be formed of silicon oxide, silicon nitride, silicon oxynitride, silicon carbide, silicon carbonitride, the like, or a combination thereof. The mask layer may be a single layer or multilayers. The mask layer may be formed by a deposition process, a photolithography process, other suitable processes, or a combination thereof. In some embodiments, the deposition process includes spin coating, CVD, ALD, the like, or a combination thereof. In some embodiments, the photolithography process includes photoresist coating (such as spin coating), soft baking, mask aligning, exposure, post-exposure baking, developing, rinsing, drying (such as hard baking), other suitable processes, or a combination thereof.

In some embodiments, the etching process of the trench 209 may include a dry etching process, a wet etching process, or a combination thereof. For example, the dry etching process may include reactive ion etch (RIE), inductively-coupled plasma (ICP) etching, neutral beam etch (NBE), electron cyclotron resonance (ERC) etching, the like, or a combination thereof. For example, the wet etching process may use hydrofluoric acid, ammonium hydroxide, or any suitable etchant.

Figure 2C:
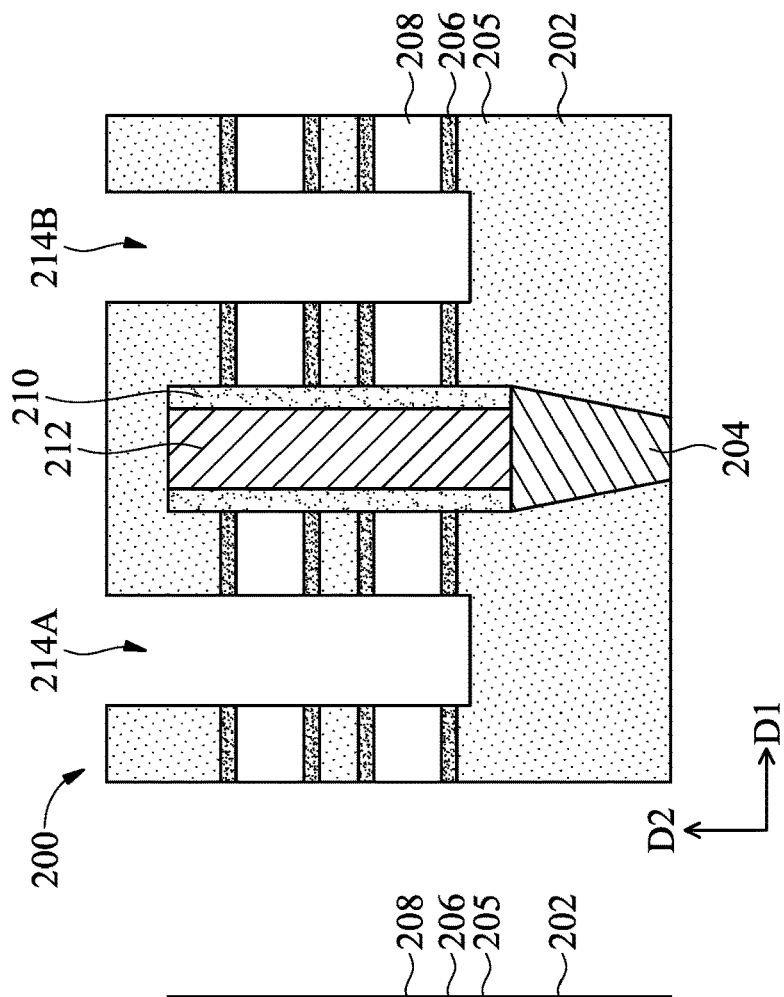
Figure 2B:
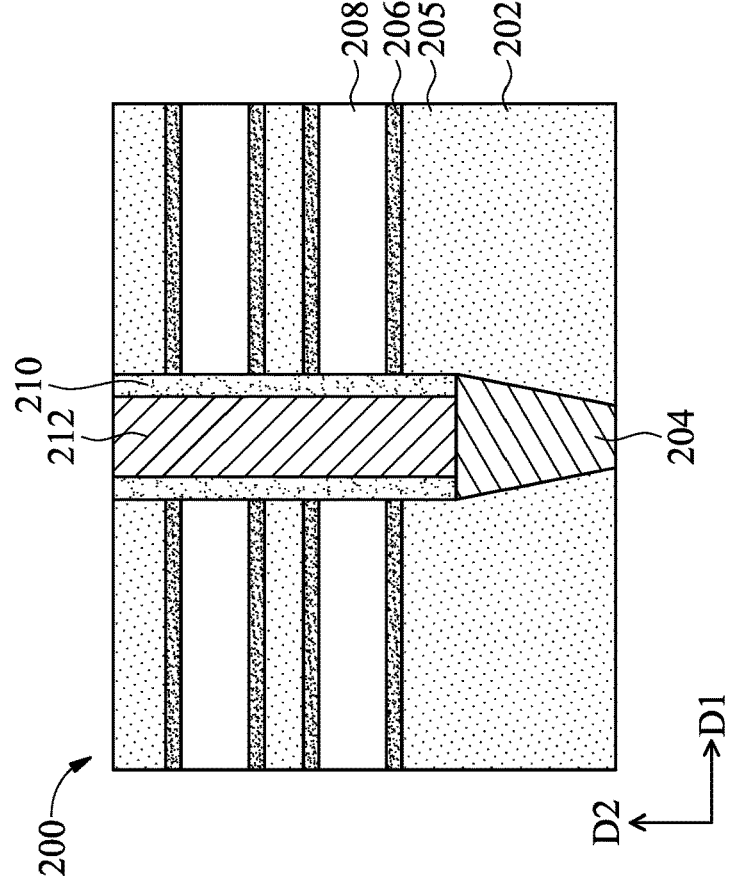

Then, according to some embodiments, as illustrated in FIG. 2B, a resistive switching layer 210 is formed on sidewalls of the trench 209. The resistive switching layer 210 may extend substantially along the second direction D2. In some embodiments, the resistive switching layer 210 includes transition metal oxides, such as nickel oxide, titanium oxide, hafnium oxide, zirconium oxide, zinc oxide, tungsten oxide, aluminum oxide, tantalum oxide, molybdenum oxide, copper oxide, the like, or a combination thereof.

The resistive switching layer 210 may be formed by an ALD process, a CVD process, a PVD process, the like, or a combination thereof.

Then, according to some embodiments, a first electrode 212 is formed in the remaining portion of the trench 209. The first electrode 212 may extend substantially along the second direction D2. The first electrode 212 may include metal or metal nitride, such as platinum, titanium nitride, gold, titanium, tantalum, tantalum nitride, tungsten, tungsten nitride, copper, the like, or a combination thereof. In some embodiments, the first electrode 212 includes copper. The first electrode 212 may be formed by an ALD process, a CVD process, a PVD process, the like, or a combination thereof.

As illustrated in FIG. 2B, the resistive switching layer 210 may adjoin the first electrode 212, and the resistive switching layer 210 is on sidewalls of the first electrode 212 and exposes the top surface of the first electrode 212. In some embodiments, the resistive switching layer 210 and the first electrode 212 extend through the electrical channel layer 208 toward the substrate 202 and are in contact with the contact 204. According to some embodiments, as illustrated in FIG. 2B, the resistive switching layer 210 and the first electrode 212 are substantially perpendicular to the top surface of the substrate 202, but the present disclosure is not limited thereto. The resistive switching layer 210 may have any suitable angle with the first electrode 212. Then, a planarization process, such as a chemical mechanical polishing (CMP) process, may be performed to remove excess materials and provide a flat surface.

Although in the embodiment of FIG. 2B, the first electrode 212 passes through the electrical channel layer 208, the top surface of the first electrode 212 is above the electrical channel layer 208, and the bottom surface of the first electrode 212 is below the electrical channel layer 208, but the present disclosure is not limited thereto. For example, the first electrode 212 may partially extend into the electrical channel layer 208 so that the top surface of the first electrode 212 is in the electrical channel layer 208.

Then, according to some embodiments, as illustrated in FIG. 2C, the dielectric layer 205 is formed on the first electrode 212 to cover the first electrode 212 and the resistive switching layer 210. Then, the through holes 214A and 214B are etched in the memory structure 200. The through holes 214A and 214B may pass through the dielectric layer 205, the high-k layer 206, and the electrical channel layer 208, and may be located on opposite sides of the first electrode 212. The formation method of the through holes 214A and 214B may be similar to the formation method of the trench 209, and will not be repeated.

Although in the embodiment of FIG. 2C, the through holes 214A and 214B pass through the electrical channel layer 208, and bottom surfaces of the through holes 214A and 214B are below the electrical channel layer 208, the present disclosure is not limited thereto. For example, the through holes 214A and 214B may partially extend into the electrical channel layer 208 so that the bottom surfaces of the through holes 214A and 214B are in the electrical channel layer 208. Alternatively, according to other embodiments, the through holes 214A and 214B may not extend into the electrical channel layer 208, and the bottom surfaces of the through holes 214A and 214B are leveled with the top surface of the electrical channel layer 208. In addition, the through holes 214A and 214B may have different depths, and the number of through holes may be more or less than two.

Then, according to some embodiments, as illustrated in FIG. 2D, barrier layers 216A and 216B are formed on the sidewalls of the through holes 214A and 214B, respectively, and conductive structures 218A and 218B are formed in the remaining portions of the through holes 214A and 214B, respectively. The conductive structures 218A and 218B may extend substantially along the second direction D2. In some embodiments, the barrier layers 216A and 216B are located between the electrical channel layer 208 and the conductive structures 218A and 218B, respectively. The barrier layers 216A and 216B may include aluminum oxide, and the barrier layers 216A and 216B may be formed by an ALD process, a CVD process, a PVD process, the like, or a combination thereof. The conductive structures 218A and 218B may include conductive materials, such as metal or metal nitride. In some embodiments, the conductive structures 218A and 218B include copper.

As illustrated in FIG. 2E, the conductive structures 218A and 218B may extend to the electrical channel layer 208, and the resistive switching layer 210 may be located between the first electrode 212 and the conductive structures 218A and 218B. In some embodiments, the top surfaces of the conductive structures 218A and 218B are higher than the top surface of the first electrode 212. According to some embodiments, as illustrated in FIG. 2D, the conductive structures 218A and 218B are substantially perpendicular to the top surface of the substrate 202, but the present disclosure is not limited thereto. The conductive structures 218A and 218B may have any suitable angle with the top surface of the substrate 202. Then, a planarization process, such as a CMP process, may be performed to remove excess material and provide a flat surface.

The depths of the conductive structures 218A and 218B depends on the depths of the through holes 214A and 214B. Therefore, as discussed above regarding the through holes 214A and 214B, the conductive structures 218A and 218B may or may not pass through the electrical channel layer 208. Particularly, the bottom surfaces of the conductive structures 218A and 218B may be leveled with the top surface of the electrical channel layer 208, or the bottom surfaces of the conductive structures 218A and 218B may be in or below the electrical channel layer 208.

Then, according to some embodiments, as illustrated in FIG. 2E, a barrier layer 220 and a second electrode 222 are formed on the electrical channel layer 208. The substrate 202, the electrical channel layer 208, and the second electrode 222 may be stacked substantially along the second direction D2. The barrier layer 220 may include titanium, titanium nitride, tungsten nitride, tantalum, tantalum nitride, the like, or a combination thereof. The second electrode 222 may include a conductive material, such as metal or metal nitride. The barrier layer 220 and the second electrode 222 may be formed each independently by an ALD process, a CVD process, a PVD process, the like, or a combination thereof.

As illustrated in FIG. 2E, the conductive structures 218A and 218B may be covered by the second electrode 222. The second electrode 222 may be electrically connected to the conductive structures 218A and 218B, so that the current 224 flows from the first electrode 212 through the electrical channel layer 208, the conductive structure 218A and 218B to the second electrode 222. Although in FIG. 2E, the second electrode 222 is electrically connected to both of the conductive structures 218A and 218B, two second electrodes 222 may be provided to be electrically connected to the conductive structures 218A and 218B, respectively.

Figure 3:
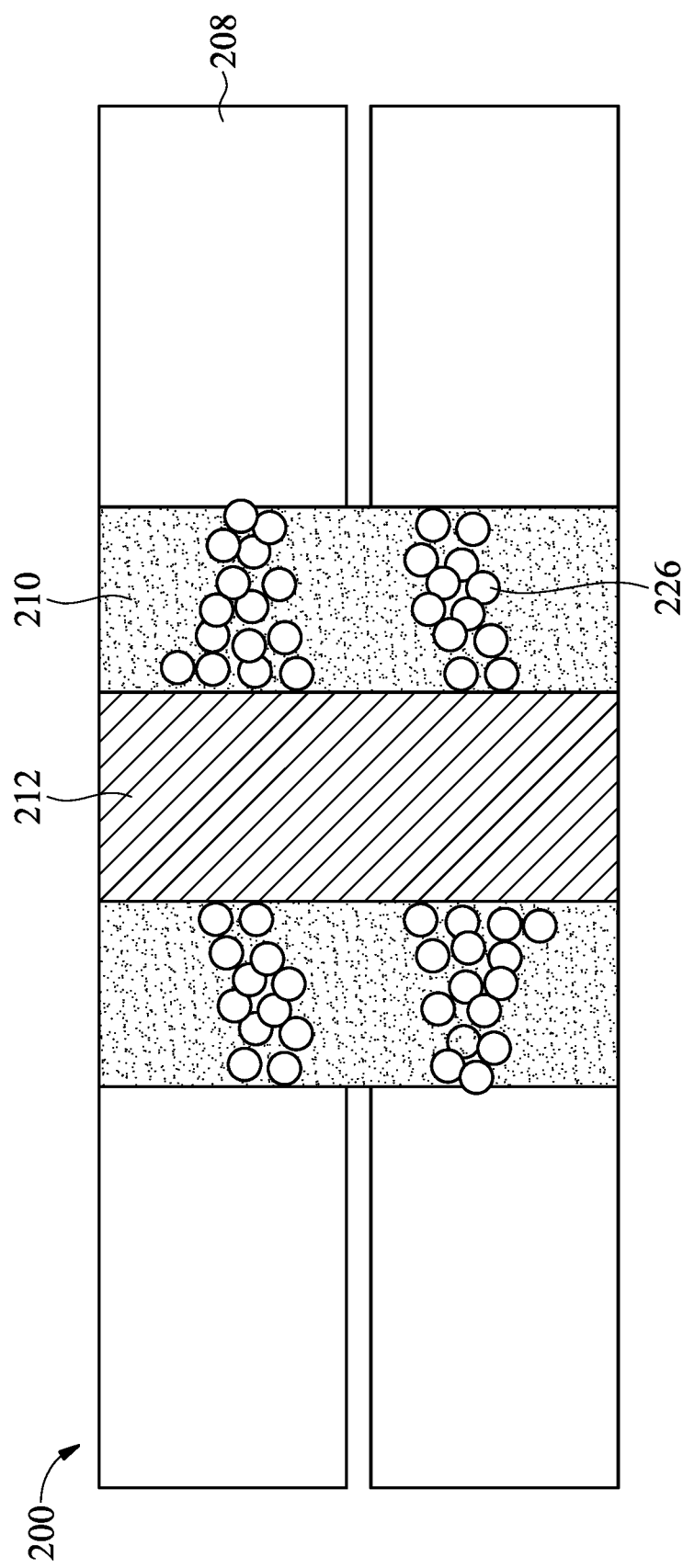
FIG. 3 is a cross-sectional view illustrating a memory structure in accordance with some embodiments.

Please refer to FIG. 3, the formation of conductive filaments 226 to form the path of the current 224 is provided. FIG. 3 is a cross-sectional view illustrating the memory structure 200 in accordance with some embodiments. For simplicity, only the first electrode 212, the resistive switching layer 210, and the electrical channel layer 208, rather than all the components in FIG. 2E, are illustrated in FIG. 3.

As illustrated in FIG. 3, the resistive switching layer 210 may be located between the first electrode 212 and the electrical channel layer 208. When a forward voltage is applied to the memory device 200, the conductive filaments 226 are formed in both sides of the resistive switching layer 210 adjacent to the electrical channel layer 208. Two electrical channel layers 208 may generate four conductive filaments 226. These conductive filaments 226 connect the first electrode 212 and the electrical channel layer 208, and form the path of the current 224 as illustrated in FIG. 2E. Therefore, the embodiments of the present disclosure in which the resistive switching layer 210 extends into the electrical channel layer 208, the number of conductive filaments can be increased without increasing the thickness of the resistive switching layer 210, and data retention can be improved.

Referring to FIG. 2E, the memory structure 200 may include the conductive structures 218A and 218B and two electrical channel layers 208. Since the number of electrical channel layers 208 and conductive structures 218A and 218B is related to the number of currents 224, the memory structure 200 may generate the currents 224 as illustrated by the four arrows. The number of conductive structures and electrical channel layers can be adjusted according to requirements. For example, the conductive structure 218A may be disposed only on one side of the first electrode 212, and more electrical channel layers 208 may be disposed, so that multiple currents can also be realized in a smaller area.

Figure 4:
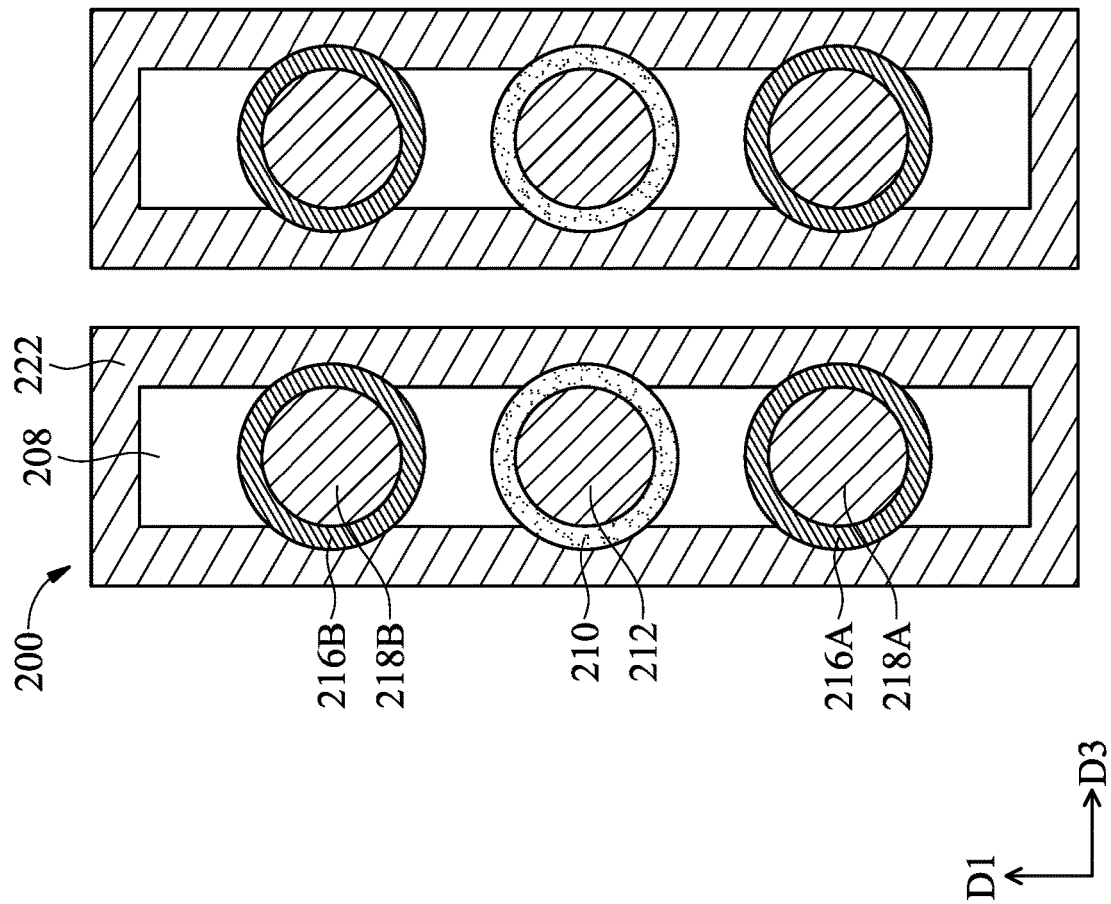
FIG. 4 is a top view illustrating a memory structure in accordance with some embodiments.

FIG. 4 is a top view of the memory structure 200 in accordance with some embodiments. As illustrated in FIG. 4, in the first direction D1, the conductive structures 218A and 218B may be disposed on opposite sides of the first electrode 212. Two memory structures 200 may be provided along the third direction D3 as illustrated, but one or more memory structures 200 may also be provided. The third direction D3 is different from the first direction D1. The third direction D3 may be substantially perpendicular or orthogonal to the first direction D1. Alternatively, the angle between the first direction D1 and the third direction D3 may be in a range from about 80° to about 90°.

In the top view, the first electrode 212 and the conductive structures 218A and 218B are circular, but may also be, for example, elliptical or other shapes. The barrier layers 216A and 216B may be disposed on the sidewalls of the conductive structures 218A and 218B, respectively, and may surround the conductive structures 218A and 218B. The resistive switching layer 210 may be disposed on the sidewalls of the first electrode 212 and surround the first electrode 212. By providing the resistive switching layer 210 which surrounds the first electrode 212, the embodiment of the present disclosure can use one resistive switching layer 210 to form a plurality of memory cells, instead of forming a plurality of resistive switching layers 212 for a plurality of memory cells. Therefore, the cost and the volume of the memory structure 200 can be reduced.

In some embodiments, the area of the top surface of the second electrode 222 may be greater than the area of the top surface of the electrical channel layer 208. The edges of the resistive switching layer 210 and the barrier layers 216A and 216B may be outside the sidewalls of the electrical channel layer 208 and inside the sidewalls of the second electrode 222. In addition, a plurality of memory structures 200 may be arranged in parallel, and these memory structures 200 may each include different numbers of components, such as different numbers of electrical channel layers 208 or conductive structures 218A, 218B. Therefore, the embodiments of the present disclosure can have good design flexibility.

In summary, the memory structure provided by the present disclosure can increase the number of conductive filaments by disposing the resistive switching layer to extend into the electrical channel layer, thereby improving data retention without increasing the thickness of the resistive switching layer. Therefore, problems associated with increasing the thickness, such as increasing the difficulty of the etching process and increasing the forming voltage of the memory structure, can be prevented.

In addition, in some embodiments, the number of electrical channel layers and/or conductive structures can be adjusted to generate the required number of conductive filaments, thus having good design flexibility. Furthermore, according to some embodiments, by increasing the number of electrical channel layers, a plurality of memory cells can be formed without increasing the resistive switching layer, so that the cost and volume can be reduced.

Although the present disclosure has been described above by various embodiments, these embodiments are not intended to limit the disclosure. Those skilled in the art should appreciate that they may make various changes, substitutions and alterations without departing from the spirit and scope of the disclosure. Therefore, the scope of protection of the present disclosure is defined as the subject matter set forth in the appended claims.

What is claimed is:

1. A memory structure, comprising:
a substrate;
an electrical channel layer disposed on the substrate;
a first electrode disposed on the substrate and extending into the electrical channel layer;
a resistive switching layer disposed between the first electrode and the electrical channel layer;
a second electrode disposed on the electrical channel layer, wherein extension directions of the electrical channel layer and the second electrode are parallel to each other in a top view of the memory structure, and an orthogonal projection of the second electrode on the substrate completely covers an orthogonal projection of the electrical channel layer on the substrate; and
a conductive structure connecting the electrical channel layer and the second electrode.

2. The memory structure as claimed in claim 1, further comprising a plurality of conductive structures connecting the electrical channel layer and the second electrode.

3. The memory structure as claimed in claim 2, wherein the conductive structures are disposed on opposite sides of the first electrode.

4. The memory structure as claimed in claim 1, further comprising a plurality of electrical channel layers disposed between the substrate and the second electrode, and the first electrode passes through the electrical channel layers.

5. The memory structure as claimed in claim 1, wherein the resistive switching layer is disposed on a sidewall of the first electrode.

6. The memory structure as claimed in claim 1, wherein the resistive switching layer surrounds the first electrode.

7. The memory structure as claimed in claim 1, further comprising a dielectric layer disposed between the first electrode and the second electrode, wherein the conductive structure passes through the dielectric layer.

8. The memory structure as claimed in claim 1, further comprising a contact disposed in the substrate and in contact with the first electrode.

9. The memory structure as claimed in claim 1, further comprising a barrier layer disposed between the conductive structure and the electrical channel layer.

10. A method of forming the memory structure of claim 1, comprising:
   forming the electrical channel layer on the substrate;
   forming the first electrode on the substrate and extending into the electrical channel layer;
   forming the resistive switching layer between the first electrode and the electrical channel layer; and
   forming the conductive structure on the electrical channel layer and connecting to a second electrode.

11. The method as claimed in claim 10, wherein forming the first electrode and the resistive switching layer comprises:
   forming a trench in the electrical channel layer;
   forming the resistive switching layer on a sidewall of the trench; and
   forming the first electrode in a remaining portion of the trench.

12. The method as claimed in claim 11, wherein the trench exposes a contact in the substrate.

13. The method as claimed in claim 10, wherein forming the conductive structure comprises:
   forming a through hole extending to the electrical channel layer;
   forming a barrier layer on a sidewall of the through hole; and
   forming the conductive structure in a remaining portion of the through hole.

14. The method as claimed in claim 10, further comprising forming a plurality of conductive structures on opposite sides of the first electrode to extend to the electrical channel layer.

15. The method as claimed in claim 10, further comprising forming the second electrode on the electrical channel layer, wherein the second electrode is electrically connected to the conductive structures.

16. The method as claimed in claim 10, further comprising forming a plurality of electrical channel layers on the substrate, wherein the first electrode extends into the electrical channel layers.

17. The method as claimed in claim 10, further comprising forming a dielectric layer to cover the first electrode before forming the conductive structure, wherein the conductive structure is formed to pass through the dielectric layer.

18. The method as claimed in claim 10, wherein the resistive switching layer surrounds the first electrode and exposes a top surface of the first electrode.

19. The method as claimed in claim 10, wherein a top surface of the conductive structure is higher than a top surface of the first electrode.

20. A memory structure, comprising:
   a substrate;
   an electrical channel layer disposed on the substrate and extending along a first direction;
   a first electrode disposed on the substrate and extending into the electrical channel layer along a second direction different from the first direction;
   a resistive switching layer disposed between the first electrode and the electrical channel layer;
   a second electrode disposed on the electrical channel layer, wherein the substrate, the electrical channel layer and the second electrode are stacked along the second direction, wherein extension directions of the electrical channel layer and the second electrode are parallel to each other in a top view of the memory structure, and an orthogonal projection of the second electrode on the substrate completely covers an orthogonal projection of the electrical channel layer on the substrate; and
   a conductive structure connecting the electrical channel layer and the second electrode and extending along the second direction.

\* \* \* \* \*